United States Patent
Jefferson et al.

(10) Patent No.: US 6,498,354 B1
(45) Date of Patent: Dec. 24, 2002

(54) SINGLE CHARGE CARRIER TRANSISTOR, METHOD OF HOLDING A CHARGE CARRIER WITHIN A QUANTUM DOT, AND METHOD OF DETECTION

(75) Inventors: John H. Jefferson, Dera Malvern (GB); Timothy J. Phillips, Dera Malvern (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/719,484

(22) PCT Filed: Jun. 18, 1999

(86) PCT No.: PCT/GB99/01885

§ 371 (c)(1),
(2), (4) Date: Dec. 13, 2000

(87) PCT Pub. No.: WO99/66561

PCT Pub. Date: Dec. 23, 1999

(30) Foreign Application Priority Data

Jun. 19, 1998 (DE) .......................................... 98 13 142

(51) Int. Cl.⁷ ............................................ H01L 29/772
(52) U.S. Cl. .............................. 257/24; 257/17; 257/20
(58) Field of Search ................................ 257/20, 24, 17

(56) References Cited

U.S. PATENT DOCUMENTS

| | | | |
|---|---|---|---|
| 5,497,015 A | 3/1996 | Ishibashi et al. | |
| 5,654,558 A | 8/1997 | Meyer et al. | |
| 5,989,947 A | * 11/1999 | Dilger | ........................ 257/24 |

FOREIGN PATENT DOCUMENTS

| | | |
|---|---|---|
| GB | 2 289 986 | 12/1995 |
| GB | 2 295 272 | 5/1996 |

OTHER PUBLICATIONS

Meirav U et al.: "Single–Electron Charging and Periodic Conductance Resonances in GAAS Nanostructures" Physical Review Letters, vol. 65, No. 6, Aug. 1990, pp. 771–774.

Wang Y et al.: "Planar Field–Induced Quantum Dot Transistor" Applied Physics Letters, vol. 63, No. 16, Oct. 1993, pp. 2257–2259.

Wang X–L et al.: "Flow Rate Modulation Epitaxy of ALGAAS/GAAS Quantum Wires On Nonplanar Substrate" Applied Physics Letters, vol. 66, No. 12, Mar. 1995, pp. 1506–1508.

Fukui T et al. "MOCVD Methods for Fabriacating Quantum Wires and Quantum Boxes" Japanese Journal of Applied Physics, Supplements, Jan. 1990, pp. 753–756.

(List continued on next page.)

*Primary Examiner*—Jerome Jackson
(74) *Attorney, Agent, or Firm*—Nixon & Vanderhye P.C.

(57) ABSTRACT

A single electron on hole field effect transistor fabricated from a narrow band gap semiconductor. The transistor is such that the valence and conduction bands have sufficiently similar energy levels such that a top region of the valence band at one point (37), e.g. under a gate electrode (34), within the current path of the transistor can be forced to be higher than the bottom region of the conduction band at another point within the transistor, allowing Zener tunelling to occur. The transistor is fabricated from semiconductors with band gaps narrow enough to allow this to occur, for instance InSb and InAlSb, CdTe and $CD_xHg_{1-x}Te$.

25 Claims, 7 Drawing Sheets

OTHER PUBLICATIONS

Okada H et al.: "A novel wrap–gate–controlled single electron transistor formed on an InGaAs ridge quantum wire grown by selective MBE" 1997 Nano Physics and Electronics International Workshop (NPE 97), Tokyo, Japan, Sep. 1997, vol. 42, No. 7–8, pp. 1419–4123, Solid–State Electronics, Jul. 8, 1998, Elsevier, UK.

Okada H et al.: "Observation of Coulomb Blodckade Type Conductance Oscilllations Up to 50 K in Gated INGAAS Ridge Quantum Wires Grown by Molecular Beam Epitaxy on INP Substrates." Japanese Journal of Applied Physics, vol. 36, No. 3B, Part 01, Mar. 1677.

Duerr C S et al.: "Interband absorption on self–assembled InAs quantum dots" Eighth International Conference on Modulated Semiconductor Structures. MSS8, Santa Barbara, CA, USA, Jul. 1997, vol. 2, No. 1–4, pp. 23–27, Physica E, Jul. 1998, Elsevier, Netherlands.

Sikorski C: "Formation of Quantum Wires and Quantum Dots on INSB Utilizing the Schottky EFFET" Journal of Vacuum Science and Technology: Part B, vol. 8, No. 4, Jul. 1990, pp. 625–629.

* cited by examiner

SINGLE CHARGE CARRIER TRANSISTOR, METHOD OF HOLDING A CHARGE CARRIER WITHIN A QUANTUM DOT, AND METHOD OF DETECTION

BACKGROUND OF THE INVENTION

1. Field of the Invention

This invention relates to an improved structure for a semi-conductor device and methods for using such a device.

2. Discussion of Prior Art

Over the last two decades there has been much interest in semiconductor devices which operate by restricting the motion of current carriers in one or more directions. In such devices the carriers can only occupy a discrete set of energy levels or sub-bands in one or more dimensions. The motion of the carriers is said to be quantised in the direction of confinement.

In heterojunctions, formed by the joining together of two semiconductor compounds of different band gaps, the carriers are confined to a potential or quantum well. A two dimensional electron gas is formed if the carriers are electrons (or a two dimensional hole gas is formed if the majority carriers are holes).

One particular type of semiconductor device which has been fabricated, typically from GaAs, is the single electron transistor which was invented in 1987. In this device the potential well is of such a size that it can hold only a few electrons (typically between 0 and 20). Furthermore, once this number is fixed (by an external contact potential) it does not fluctuate in time by more than one electron.

Such devices are confined to operate at low temperatures (typically less than liquid nitrogen temperatures) due to the physics which allows them to function. The devices rely on the fact that the potential well has a small capacitance, and the energy that it takes for electrons to charge this well is quite large. If the device is cooled to low temperatures the electron thermal energy becomes less than the charging energy. Without a significant source-drain voltage bias the electrons cannot travel through the potential well. This is known as Coulomb blockade.

SUMMARY OF THE INVENTION

According to a first aspect of the invention there is provided a field effect single electron transistor fabricated from a narrow band gap semiconductor.

Single Electron Transistors (SET) have the highest charge sensitivity of any man-made device. The SET is suited for applications where it is necessary to measure small fluctuations of charge without disturbing the system under study, or for providing low power transistor action. They also have potential for sensitive detectors of pressure, acceleration and temperature at least. Other detectors may be envisaged.

The transistor of the first aspect of the invention may be referred to as a Zener single electron transistor (Zener SET). Prior art transistors can be referred to as unipolar single electron transistors.

Zener SETs are advantageous because they are potentially simpler to fabricate and control, they may operate at higher temperatures than prior art devices, both n-type and p-type devices may be fabricated, and confinement may be enhanced due to the low effective mass of conduction electrons in p-type devices.

Further advantages of single electron transistors are that they are physically small (e.g. nanoscale) when compared to conventional field effect transistors resulting in a higher packaging density though lower power density.

The transistor preferably contains a heterojunction between layers of a first and a second material. The first material may be InSb or $Cd_xHg_{1-x}Te$.

The second material may be InAlSb or CdTe or $Cd_xHg_{1-x}Te$. The heterojunction may be provided as a single layer of first material adjacent to a single layer of second material. Alternatively, the heterojunction may be provided as a single layer of first material between two layers of second material.

Should the heterojunction be provided as a single layer of first material adjacent to a second material, the second material may be an oxide (i.e. may be an insulator) or may be a semi-conductor. The first material may be considered a narrow band gap semiconductor. In the cases wherein the second material is a semi-conductor it may be considered a wide band gap semi-conductor. Other materials may be suitable for the first and second materials.

The skilled person will realise that should the first material be $Cd_xHg_{1-x}Te$ the band gap can be tailored to any desired value by adjusting the value of x. As x tends to $\approx 0.15$ the band gap of the material tends to zero. However, x may be chosen to be an optimal value.

Should the second material be $Cd_xHg_{1-x}Te$ the value of x may be chosen to tend to one (that is CdTe). CdTe is preferred for its electronic properties but may not be achievable in view of other physical considerations: for example crystal growth considerations and lattice mismatch.

There may be provided on a first side of the heterojunction a third material which may be provided as a layer. The third material may function as a first gate electrode. The third material may be a metal. It may be Al or Au, or may be any other suitable conductor. Such a structure is advantageous because the presence of the gate electrode allows the electron/hole gas to be controlled within the heterojunction.

A second gate electrode may be provided on a second side of the heterojunction which is on the opposite side of the heterojunction from the first side. The second gate electrode may be fabricated from a metal. Such a structure in combination with the first gate electrode allows the electron/hole gas to be controlled.

The second gate electrode may be insulated from the materials forming the heterojunction by at least a single layer of insulation. An insulation layer is advantageous in that it modifies the interaction between the second gate electrode and the heterojunction in such a way as to give the desired functionality.

At least one (and preferably two) side gate may be provided. These may help to control the electron/hole gas in the desired manner.

The side gates may be insulated from the materials forming the heterojunction by a layer of insulation.

The side gate may comprise an elongate area along one side of the first or second material above the heterojunction. Preferably when two side gates are provided each forms an area along a side of the first or second material which sides are opposite each other. The areas may be rectangles. Most preferably the two side gates are in the same plane and there exists a gap within that plane between the two areas of side gates. The side gates preferably extend generally parallel to each other.

Preferably, the second gate electrode is provided above and may be insulated from the side gate. Again such a structure allows the electron/hole gas to be controlled in the desired manner.

The insulation may be silicon dioxide $SiO_2$ or any other suitable insulation material. Indeed, different types of insulation material may be used for different layers of insulation. Or indeed, the layers of insulation separating the materials of the heterojunction and the side gate may be the same as the layers of insulation separating the side gate from the second gate electrode.

Preferably the second gate electrode comprises a primary portion which extends over the gap between the side gates. Such a structure may have a large influence in the electrons in the electron/hole gas.

The second gate electrode may have a first broad region connected to a second broad region via a narrower waist region. The second gate electrode may be a bow tie shape possibly with the central, waist, portion of the bow tie extending over the gap between the side gates.

The skilled person will appreciate that the effect of the side gate electrodes may be thought of as creating a quantum wire wherein electrons or holes are held by an applied electric field in a narrow strip within the electron sheet. The use of electrodes to form the quantum wire may be thought of as soft confinement.

An alternative, or additional, way of forming the quantum wire may be with hard confinement as opposed to through the provision of side gates (soft confinement).

In one embodiment the heterojunction may be provided between a strip of first material and a layer of second material. That is the width of the first material may be much less than the width of the second material. This potentially provides a hard confined quantum wire. The first and second materials may be as described in relation to the embodiments hereinbefore. In particular the first material may be thought of as a narrow band gap semi-conductor and the second material may be thought of as a wide band gap semi-conductor.

The strip of narrow band gap semi-conductor may have a width of substantially 50 nm. However, the strip may have a width substantially in the range 10 nm to 90 nm. More preferably the width of the strip may be substantially in the range 25 nm to 75 nm.

In this embodiment a second gate electrode may be provided overlying the strip of narrow band gap semi-conductor. The second gate electrode may or may not overlie regions of the wide band gap semi-conductor where no narrow band gap semi-conductor is present. Preferably the second gate electrode has the bow tie structure discussed hereinbefore.

Preferably the second gate electrode is separated from the semi-conductor materials by a layer of insulator which may be silicon dioxide.

The narrower waist region of the second gate electrode may have a width of substantially 50 nm. However, the narrower waist region may have a width substantially in the range 10 nm to 90 nm. More preferably the width of the narrower waist region may be substantially in the range 25 nm to 75 nm. The skilled person will appreciate that this may form a region where the second gate electrode overlies the narrow band gap semi-conductor which is substantially square having a side of substantially 50 nm.

In an alternative embodiment the quantum wire may be provided by the V-Groove method for fabricating quantum wires. This may be preferred over the method of providing a thin strip of narrow band gap semi-conductor because the confinement offered may be cleaner.

The transistor may contain a V shaped notch or groove within a substrate layer.

A layer of second material may be provided lining the groove. The layer of second material may also form a V shaped notch or groove. A region of first material may be provided in the V of the notch in the second material.

The notch may be substantially filled with a layer of insulation. However, the notch may be partially filled with insulation such that the first material is covered. The insulation may cover the region of first material. Preferably a second gate electrode is provided on top of the layer of insulation. Preferably the second gate electrode has a bow tie shape having a primary portion as described hereinbefore. The primary portion of the second gate electrode may overlie the region of first material. A plurality of quantum wires may be provided in a single groove. The wires may be stacked one above the other.

In yet another embodiment the transistor may have a layer of second material having a non planar surface upon which a quantum wire has been fabricated.

The substrate may have a surface which is stepped (i.e. has a plurality of steps) due to being cut off axis. That is off-axis to a material lattice plane having atoms aligned to form a smooth surface. The angle of a plane of the stepped surface of the substrate may be adapted to provide a specified distance between steps. The distance may be in the range 0.1 $\mu$m to 1 $\mu$m. The skilled person will realise the more acute the angle the longer the distance between the steps.

Regions of first material may be provided in regions associated with the steps in the second material. The regions of the first material may be covered with an insulator. The insulator may also cover the surface of the second material where there is no first material provided. It will be appreciated by the skilled person that when fabricating quantum wires by such a method the thin layer of the first material may cover the entire non planar surface of the second material with regions being concentrated in regions associated with the steps.

A second gate electrode may be provided on top of the layer of insulation overlying the regions of first material. The gate may have substantially the dimensions as discussed hereinbefore.

The second gate electrode may overlie a number of regions of first material. The regions of first material may be considered to be quantum wires.

In yet another embodiment the transistor may comprise at least one ridge grown quantum wire. The ridge grown quantum wire may include reverse mesa etched from a substrate. Ridges in-between the reverse mesa may have a layer of second material provided upon a surface. On a surface region of the layer of second material there may be provided a region of first material.

A second gate electrode may be provided overlying the region of first material and the second gate electrode may be separated from the first material be a layer of insulation.

The transistor may be thought of as providing a controllable single potential maxima or minima along a quantum wire. That is providing a quantum dot within a quantum wire.

The various techniques for forming quantum wires are disclosed in the PhD thesis of Matthew John Steer, dated October 1997, entitled "Optical and Structural Characterisation of III–V Semiconductor Quantum Wires and Quantum Dot Structures" from the University of Sheffield. This thesis is incorporated by reference and the skilled person is directed to read this thesis.

At a third and fourth end of the transistor (which are at opposite ends of a plane parallel with the first and second sides) there may be provided a drain and a source electrode. The drain and source electrodes allow a bias voltage to be applied to the electron/hole gas to cause the carriers to flow through the transistor.

Preferably the dimensions of the primary portion of the second gate electrode are such that it is less than substantially 100 nm in width measured along an axis perpendicular to the drain and the source. More preferably less than 75 nm and most preferably less than substantially 50 nm.

The transistor may be fabricated so that the primary charge carriers may be either holes or electrons. That is the device may be fabricated so that it is p-type or n-type. This has the advantage that circuits could potentially be fabricated from a number of transistors according to the invention such that the device would use complementary technology similar to the philosophy behind CMOS technology. As the skilled person will realise this is advantageous in that such devices are low power because they have substantially zero quiescent current.

Should the device be fabricated from p-type samples there is the advantage that there is enhanced quantisation in the confined region.

In use, should the primary charge carrier be electrons, the primary portion of the second gate electrode may cause a single potential barrier when a bias voltage is applied between the first and second gates. (Conversely if the primary charge carriers are holes a single potential well may be caused when a voltage is applied between the first and second gate).

It may be possible to cause an equivalent potential barrier or well within a non-narrow band gap semi-conductor by applying high gate bias potentials. However, the gradient of the potential field would be such that electrons could not be held within the field; any electron within the well or barrier would be able to Zener tunnel out of the region. That is, the wave function would leak out of the well or barrier, due to the steepness of the sides.

With a sufficiently high gate (first gate to second gate) bias voltage unoccupied quantised energy levels will occur in the valence band below the primary portion of the second gate electrode. These energy levels may be occupied by charge carriers tunnelling from the conduction band to the valence band (Zener tunnelling).

Narrow band gap may be defined as a material having a valence band at an appropriate level to complement the conduction band such that electrons can use the valence band to tunnel in the manner described hereinbefore. An alternative or additional definition of narrow band gap may be the use of a material having a band gap of less than substantially 1 eV between the conduction and valence bands. Most preferably a band gap of less than substantially ½ eV may exist between the conduction and valence bands.

Should the heterojunction be provided as a layer of first material between two layers of second material, the layers may be arranged such that a permanent strain is caused throughout the layer of first material. This is advantageous because it may shift the energy of heavy holes within the valence band such that electrons tunnelling through the transistor can only utilise light holes. As a result of this it is likely that the performance of an n-type device will be as good as the p-type device due to the low effective mass of the light holes.

According to a second aspect of the invention there is provided a method of holding a charge carrier within a quantum dot created by a pair of gate electrodes across a heterojunction, in which a bias voltage applied across the gate electrodes cause a single potential barrier or well within a sheet of charge near the heterojunction such that one or more charge carriers are confined within the barrier or well.

Preferably the method comprises using narrow band gap semi-conductors to provide the sheet of charge. These may show the necessary physical properties to allow the single maxima or minima of field to be provided, in which a charge carrier can be held within.

A potential barrier would be caused in an n-type device and a potential well would be caused in a p-type device.

The method may comprise cooling the heterojunction, for example to substantially liquid nitrogen temperatures (77K). The method may comprise cooling the heterojunction to below liquid nitrogen temperatures, perhaps to substantially liquid helium temperatures (4K).

As discussed in the introduction such cooling may bring the thermal energy of the charge carriers below the charging energy of the quantum dot.

The method may comprise applying a bias along the heterojunction (between a source and drain electrode) such that charge carriers are caused to flow along the heterojunction when potential caused by the gate electrodes allows.

According to a third aspect of the invention there is provided a method of detection comprising using a charge detector wherein the gate electrodes of a field effect transistor according to the first aspect of the invention are connected to a potential source which is representative of the quantity being detected such that variations in the quantity causes variations in the potential applied to the gate electrodes which, in turn, causes a change in current flowing through the transistor.

An advantage of such a device is that the effect may be used directly to measure small changes in an electric field (perhaps this can be thought of as a sensitive electrometer).

Preferably the change of current caused is on an order substantially equal to the original current flowing through the transistor.

Further possible applications may be the formation of an accelerometer or may be of a pressure sensor. The forces exerted on a Zener SET may be enough to alter the physical dimensions of the potential barrier or well. This may change the energy of a quantised level in the valence band relative to the Fermi energy (the energy levels are a function of geometry as well as a function of applied bias voltage) thus causing a change in the current flow through the device.

The method may have a sensitivity comparable with that of a scanning electron microscope.

According to a fourth aspect of the invention there is provided a single electron transistor which relies on Zener Tunnelling of electrons into the valence band of the semi-conductor material from which it is fabricated, to provide transistor action.

According to a fifth aspect of the invention there if provided a single electron transistor in which the energy levels of heavy holes within the valence band are shifted below the energy levels of light holes.

This has the advantage that only light holes are used as electrons tunnel into the valence band so that it is likely the performance of an n-type device will be as good as the p-type device due to the low effective mass of the light holes.

Preferably the energy level of the energy levels of heavy holes are shifted by applying a permanent strain to a material in which electron confinement occurs.

Preferably the material in which the electron confinement occurs in a narrow band gap semi-conductor, which may be provided between two layers of wide band gap semi-conductor.

The strain may be applied to the narrow band gap semi-conductor by lattice strain caused by interaction with the wide band gap semi-conductor.

BRIEF DESCRIPTION OF THE DRAWINGS

There now follows by way of example only a detailed description of the present invention with reference to the accompanying drawings of which:

FIG. 10b shows the potential distribution across the junction shown in FIG. 10a;

FIG. 11b shows the potential distribution across the junction shown in FIG. 11a.

DETAILED DISCUSSION OF EMBODIMENTS

Figure 1:
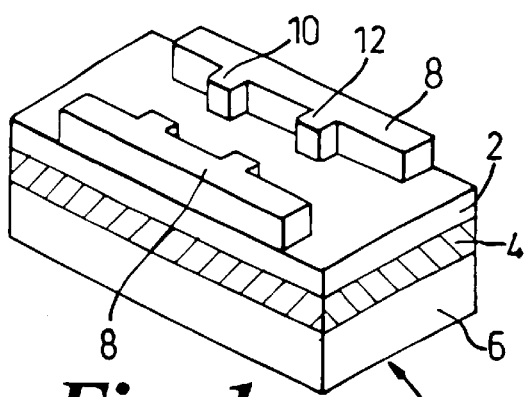
FIG. 1 shows a single electron transistor according to the prior art.
Figure 2A:
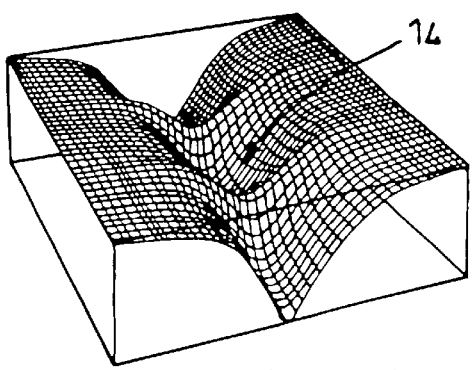
FIG. 2a shows the potential energy profile through a 2 dimensional plane close to the heterojunction of the transistor of FIG. 1.
Figure 2B:
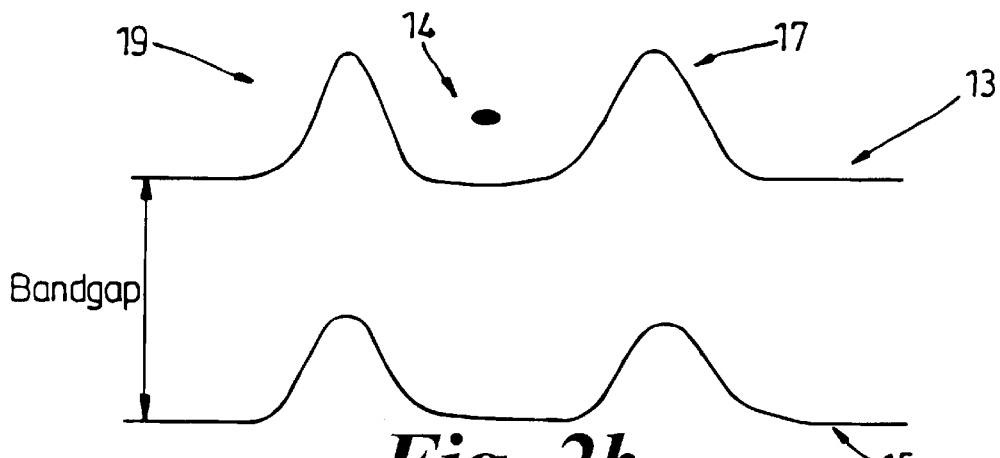
FIG. 2b shows an energy level diagram for the potential field diagram of FIG. 2a (along a line containing the potential minima)

FIGS. 1 and 2a–2b show the prior art wherein a single electron transistor (or unipolar SET) is provided from a heterojunction of typical III–IV semi-conductors such as GaAs.

In FIG. 1 a device 1 is provided having a layer of GaAs 2 adjacent a layer of $Al_xGa_{1-x}As$ 4 to form a heterojunction. A first gate electrode 6 is provided at a bottom region of the device and a pair of second gate electrodes 8 are provided at a top portion of the device opposite the heterojunction from the first gate electrode 6.

Each of the second gate electrodes 8 comprises an elongate member with two stubs 10, 12 symmetrically arranged about a central axis of the elongate member projecting toward the centre of the device.

Electrons can be confined in a direction perpendicular to an axis passing through both of the gate electrodes in a thin sheet in the GaAs 2 just above the $Al_xGa_{1-x}As$ 4 close to the heterojunction interface. A potential energy profile of this sheet is shown in FIGS. 2a–2b.

The skilled person will realise that there are two saddle points caused in the potential energy profile of FIGS. 2a–2b which occur in the thin sheet below the stubs 10, 12. The magnitude of the saddle points can be controlled according to the potential applied between the gate electrodes.

FIG. 2a shows an energy level diagram. The conduction band 13 and the valence band 15 are shown. Peaks 17, 19 in these bands are caused by the field from the gate electrodes 10, 12. The region 14 of FIG. 2b is shown to be between the two peaks K in the conduction band 13. The skilled person will appreciate that the valence band 15 is not important in the unipolar SET because of the large band gap (it is so far removed when looking at the energies that it plays no role in the functioning of the device).

The region 14 of minimal potential is referred to as a quantum dot and the confinement is said to be soft since it is controlled by the voltage on the gate electrodes. Conversely, confinement out of the thin sheet is said to be hard since it is due to the heterojunction step itself. At low temperatures with low bias voltages applied to the gate electrodes the source-drain resistance (in a direction perpendicular to an axis passing between the gate electrodes) will essentially be infinite provided the source-drain voltage difference is small (that is $V_{SD} \ll e/C$ where C is the effective capacitance of the dot).

Increasing the gate voltage will lower the barriers (and the position of the well relative to the Fermi energy) and eventually the lowest quasi-bound state in the well will be resonant with the Fermi energy allowing an electron to tunnel into the well. For small voltages applied in the drain source direction a current will flow. This current is due to single electrons moving into and out of the quantum dot 14. An electron entering the dot form the source must leave the dot before another electron can enter due to the large Coulomb repulsion between two electrons within the dot 14. This is due to the so-called Coulomb blockade. A further increase in the gate voltage will lower the resonant-bound state energy relative to the Fermi energy and the dot 14 will remain charged with a single electron. There is again a barrier to current flow at low temperature. The electron in the dot cannot leave since its energy is below the Fermi energy and a further electron may not enter the dot 14 because of Coulomb repulsion (Coulomb blockade). The 20 current is essentially switched off. A further increase in the gate voltage will eventually lower the potential energy in the dot sufficiently for a second electron to enter the dot 14 giving rise once more to a single-electron current. In this way we get a series of current peaks as the gate voltage is varied with each peak corresponding to fluctuations in electron number of just one in the dot 14. This current is shown schematically in FIG. 3 where it should also be noticed that the peaks are approximately equally spaced, which may be explained by an approximate semi-classical charging model in which the separation between peaks is potential V=e/C (Where e is the charge on the electron and C is the capacitance of the dot). These peaks in conductance as a function of gate voltage are referred to as the single electron transistor (SET) oscillations.

Figure 3:
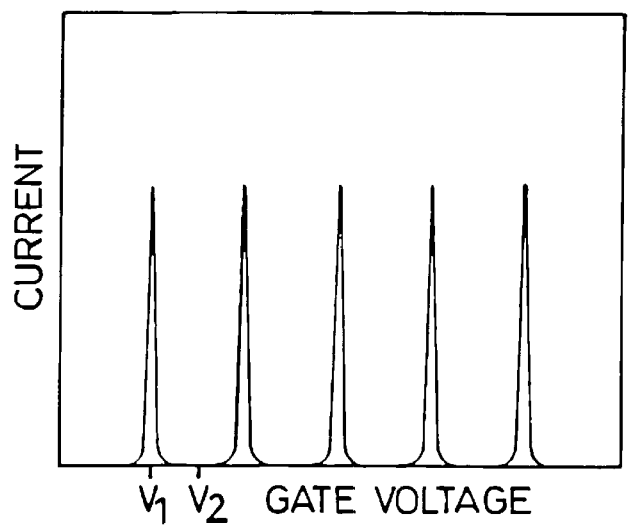
FIG. 3 shows the idealised current flow through a single electron transistor at T=0K.

Looking at FIG. 3 maximum current will flow through the transistor when the gate voltage equals $V_1$. Should the gate voltage be held at $V_1$ continuous current would flow through the device. As will be evident from FIG. 3 due to the large gradient of the I Vs V curve, when the gate voltage is held at $V_1$, a small change in applied gate voltage causes a large change in current flowing through the transistor (again for $V_{SD} \ll e/C$).

Figure 4:
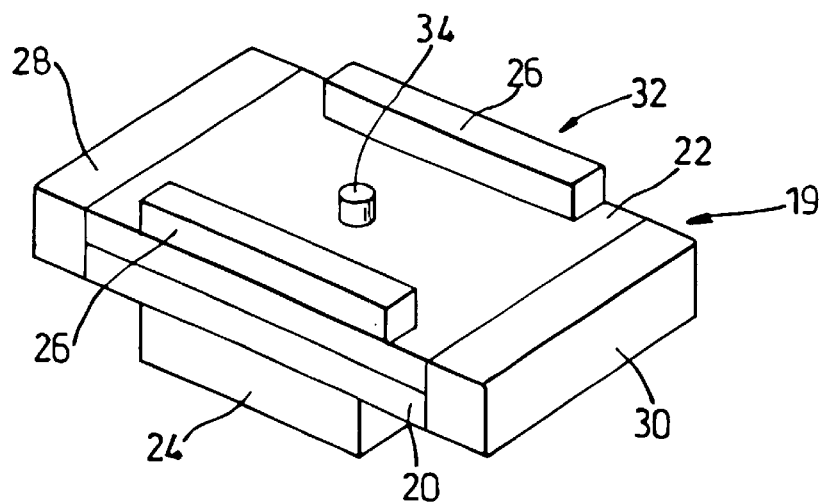
FIG. 4 shows a diagrammatic representation of a simplified embodiment of the invention.

An approximation of a device 19 according to the present invention is shown in FIG. 4. This simplified structure makes it clear just how the device operates and the structure has been used to explain the concept.

A layer of InAlSb (wide band gap second material) 20 is provided in association with a layer of InSb 22 forming a heterojunction wherein carriers are hard confined in a thin sheet in the InSb 22 (narrow band gap first material) just above the InAlSb 20 close to the heterojunction interface. Thus, a so called two dimensional electron (or hole) gas is formed near to the heterojunction.

A first gate 24 electrode is positioned at a first side of the heterojunction and a side gate electrode 26 comprising a pair of electrodes is positioned at the opposite side of the heterojunction. Each one of the side gate electrodes 26 comprises an elongated metallic electrode. A drain 28 and a source 30 electrode are positioned at ether end of layers of InSb 22 and InAlSb 20 (along a plane running parallel to the heterojunction).

A second gate electrode 34 which in this case is circular (but in other embodiments could be a different shape, perhaps a cube or rectangle) is positioned between the side gate electrodes 26.

The size of the second electrode 34 and spacing from the side gate electrodes 26 is critical to the operation of the device. Clearly, the geometry of the electrodes 26, 34 effect the potential field in the two-dimensional electron gas near to the heterojunction interface, as does the field applied to the gate electrodes.

Figure 5:
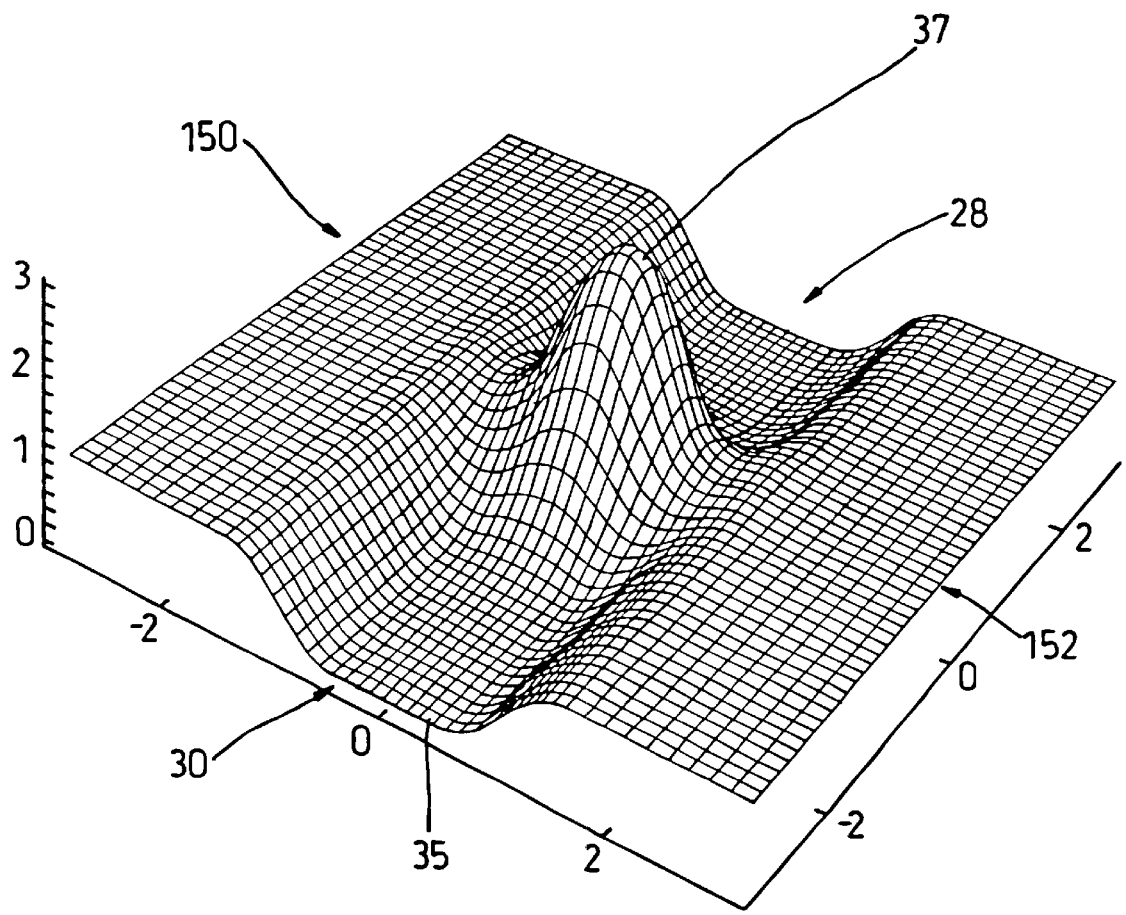
FIG. 5 shows the potential energy profile for a 2 dimensional plane near the heterojunction interface of the transistor of FIG. 4 in a n-type device.

In use a potential applied to the first, side and second gate electrodes 24, 26 and 34 causes a potential energy field as shown in FIG. 5. (The position of the drain 28 and the source 30 electrodes are shown at either end of FIG. 5 to show the orientation of the Figure relative to the device shown in FIG. 4). The graph shows the potential along a two dimensional plane in the InSb close to the heterojunction. The z-axis of the graph represents the potential at each point in the plane.

In operation, (for an n-type device) the side and second electrodes 26, 34 would be biased negatively relative to the first electrode 24. Furthermore, the bias on the second electrode 34 would be most negative. Conversely, for a p-type device on the side and second electrodes 26, 34 would be biased positively relative to the first electrode 24, with the second electrode 34 being most positive.

Looking at FIG. 5, the field due to the potential applied between the first and side electrodes 24, 26 causes a gulley 35. The field due to the potential applied between the first and second electrodes 24, 34 causes the potential barrier 37. FIG. 5 is for an n-type device. Similarly, a p-type device would have a central potential well.

A potential is also applied between the drain 28 and source 30 electrodes ($V_{SD}$). The skilled person will appreciate that $V_{SD}$ causes a slight bias on electrons within the transistor causing them to tend to move towards the drain 28 electrode. When an electron is within the potential barrier 37 it may Zener tunnel out of the barrier 37 either toward the source 30 or drain 28 electrodes. Without $V_{SD}$ being applied there would be an equal chance of either direction occurring. However, $V_{SD}$ increases the probability of electrons tunnelling out of the barrier 37 in the direction of the drain 28 electrode.

$V_{SD}$ is necessarily small and has a maximum magnitude of substantially kT (approximately 25 meV at room temperature). Should $V_{SD}$ have too large a magnitude electrons will pass through the potential barrier 37 without being held inside.

At a central portion of the potential energy field there is a maximum of potential which occurs near the heterojunction in a region below the third gate electrode 34 (At 37 in FIG. 5). As with the device of FIG. 1, as the potential applied between the first 24 and second 34 gate electrodes is varied the height of the maximum 37 is altered. Also, varying the potential applied between the first and side 24, 26 gate electrodes causes the depth of the gulley 35 to be varied, by varying the magnitude of the edge portions of the gulley.

The skilled person will realise that in FIG. 2 there were two potential barriers between which an electron could be held (in a quantum dot) whereas in FIG. 5 at 37 there is only a single electron potential energy maximum. However, as will now be described the device of FIG. 4 can be made to operate in a similar manner to that of the device of FIG. 1.

The device 19 makes use of the narrow band gap which exists in materials such as InSb and $Cd_xHg_{1-x}Te$. That is the energy level of the valence band is relatively close to the energy level of the conduction band when compared to other III-V semi-conductors such as GaAs and InAs.

When looking at the physics of the device shown in FIG. 1, because of the large band gap between the valence and the conduction bands, the valence band can be ignored in an n-type device. As shown in FIG. 2 electrons are trapped in a quantum dot formed between two peaks in the conduction band of the heterojunction.

However, in the device of FIG. 4 the valence band cannot be ignored and energy level diagrams are shown in FIGS. 9 to 10.

A material used for this embodiment has a narrow band gap. That is, the valence band is at an appropriate level to complement the conduction band so that electrons can use the valence band to tunnel.

If a bias voltage is applied to the gate electrodes 24, 26, 34 the conduction and valence bands of the InSb move. If a high enough bias voltage is applied to the gate electrode 34 the energy of the valence band edge below this gate can be higher than the conduction band edge at a point along the gulley 35.

Figure 8A:
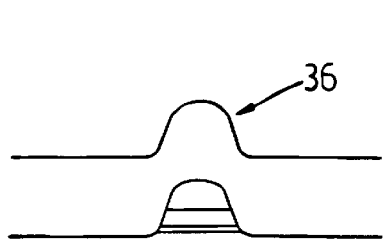
FIGS. 8a–8c show an energy level diagram for an n-type device according to the present invention.
Figure 8B:
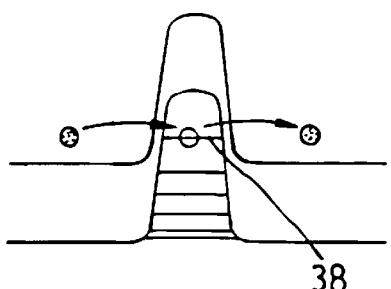
Figure 8C:
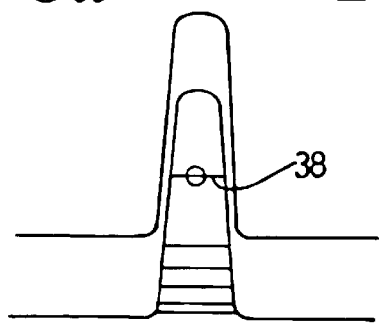

This process is shown in FIGS. 8a–8c for a device fabricated in n-type material wherein the majority charge carriers are electrons. Applying a negative voltage to the third gate electrode, 34 raises both the valence and conduction bands and a single hump 36 appears in the energy band diagram (FIG. 8a). The important point to notice is that due to the high confinement, the region under the barrier in the valence band gives rise to discrete energy levels. When the Fermi energy lies above the highest level, the resistance will be effectively infinite at small biases.

In FIG. 8b a larger negative bias voltage has been applied to the gate electrode 34 raising the valence band above the conduction band in a position along the gulley 35. At a certain bias voltage, the energy of a level 38 within the valence band will be coincident with the Fermi energy and electrons will be able to tunnel into and out of this energy level 38 (represented by the line and unfilled circle). Because of Coulomb repulsion between the electrons and quantisation of the energy levels only a single electron at a time can enter the energy level 38.

Because tunnelling from conduction band to valence band is known as Zener tunnelling we refer to this device as a Zener single-electron transistor (Zener SET).

FIG. 8c shows that if a further bias voltage (is made more negative) is applied to the gate electrode 34 then the energy level 38 moves above the Fermi energy and electrons can no longer tunnel across the heterojunction. Therefore, the device of FIGS. 4, 6, and 7 operates in a manner similar to that of the device of FIG. 1 and current flows as is shown in FIG. 3. There is a large gap between the unoccupied level in the dot and the next (unoccupied) level, representing both the quantisation gap of the single-electron states, due to confinement and the Coulomb blockade energy (energy of repulsion between two charge carriers in the dot). Note, however, that for the conventional SET the gate bias is increased whereas for the Zener SET it is decreased.

As the skilled person will appreciate there exist both heavy and light holes within the valence band. The separation of the holes is proportional to the reciprocal of the effective mass and therefore the heavy holes have a smaller separation. Electrons only have a single effective mass and this is equal to the mass of a light hole.

As electrons tunnel into the valence band they can occupy heavy or light holes. Coulomb blockade will effect the electrons in the same way regardless of whether heavy or light hole states have been occupied and prevent more than one electrons occupying that particular hole state.

It is desirable for the electrons to occupy light hole states due to the larger energy gap between these hole states meaning that the transistor is less influenced by changes in temperature. As the temperature increases so does the probability that an electron in the gulley 35 region be thermally excited above the Fermi energy. Should the electrons energy become coincident with that of the hole state conduction will occur. Since the light holes have a larger energy separation more temperature change is likely to be needed to equate the energy of the hole state to the energy of the thermally excited electron in the gulley 35.

By applying a physical elastic strain it is possible to shift the heavy and light hole bands apart, reducing the energy levels of the heavy holes so that only light holes can be used for tunnelling. It is possible using the wide, narrow, wide band gap structure discussed hereinafter to apply a permanent strain to the material.

The skilled person will realise that the wide band gap structure has a small lattice spacing. By growing the narrow band gap structure thin enough in association with the wide band gap material it is possible to ensure the lattice matching causes a permanent compression throughout the narrow layer. This ensures only the light holes are utilised for tunnelling. That is, the lattice of the narrow band gap material must match the lattice of the wide band gap material at the interface; because the wide gap has the smaller spacing the narrow gap material will be strained by the matching of the lattices.

The skilled person will also appreciate that as an electron tunnels into the valence band, the energy gap to hole states above the Fermi energy within the valence band effectively increases (due to Coulomb blockade).

Figure 9A:
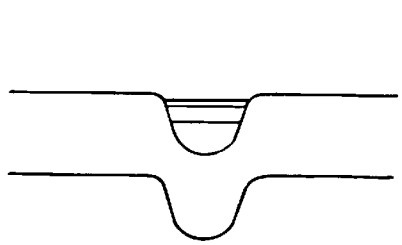
FIGS. 9a–9c show an energy level diagram for a p-type device according to the present invention.
Figure 9B:
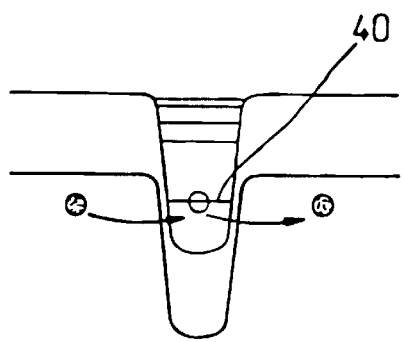
Figure 9C:
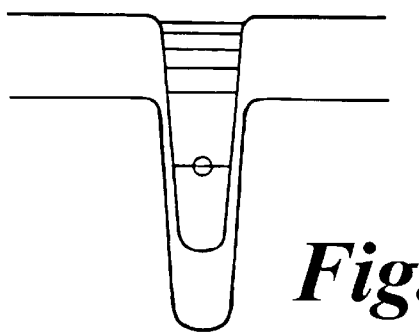

FIGS. 9a–9c show a similar energy level diagram to FIGS. 8a–8c but for a device fabricated from p-type material wherein the majority charge carriers are holes. In this situation if a sufficiently large positive bias is applied to the gate electrode 34 the conduction band edge below this gate electrode may become lower than the Fermi energy.

Once the energy level 40 becomes coincident with the Fermi level electrons can Zener tunnel from the valence band into the quantum confined conduction band region. This is equivalent to holes Zener tunnelling out of the quantum confined region into the valence band (FIG. 9b). If the bias voltage is further increased the energy level 40 drops below the Fermi energy and electrons can no longer tunnel across the heterojunction.

Such a p-type SET has the advantage over the unstrained n-type SET of enhanced quantisation in the confined region due to the lower effective mass of the conduction-band electrons.

A quantum dot, such as occurs in the confined region of a SET, behaves in some ways like an atom showing, for example, electron affinity, and ionisation in the Coulomb blockade regime, where at low-temperatures the quantum dot will have an integral number of charge carriers. It has been suggested that a quantum dot may be referred to as an 'artificial atom'. (Dots occupied with one, two, three . . . electrons being artificial H, He, Li respectively . . . ). Two artificial atoms in series will be the analogue of molecules. For the Zener set such a molecule may be fabricated by creating two barriers as was done for the single SET in GaAs. A typical conduction band edge profile would be similar to that for the single SET in GaAs but the device would behave quite differently due to the presence or resonant levels in both the valence bands (barrier regions) and conduction band (well region).

Finally, there is one further fundamental difference between the Zener SET and the conventional SET. In the latter, the tunnelling barriers into and out of the quantum dot must have high resistance (>>the resistance quantum ≈13k Ω) in order to have strong confinement. If this were not the case then the resonant bound state would be broadened, the Coulomb blockade reduced and the device would always be switched on. This need not be the case for the Zener SET. Provided the single barrier is sufficiently strong the device will be essentially 'off' at the appropriate gate bias since the tunnelling of conduction electrons will be small (FIG. 9a). However, when the barrier height is increased by applying a negative bias to the gate, the Zener tunnelling barriers need not be strong in order for the transistor to switch on. These Zener barriers may be 'tuned' by choice of semi-conductor and geometry. For weak barriers the current through the device will be relatively large, significant 'co-tunnelling' will take place and the fluctuations in electron number on the quantum dot may well exceed unity. This will also cause the 'turn on' to be more gradual and will reduce the Coulomb blockade, resulting in weaker SET oscillations.

However, this mode may be preferable for some applications where a low 'on' resistance is required. Conversely, for strong Zener barriers, the turn-on will be sharp and the subsequent SET oscillations sharp, as with the unipolar device.

Figure 6:
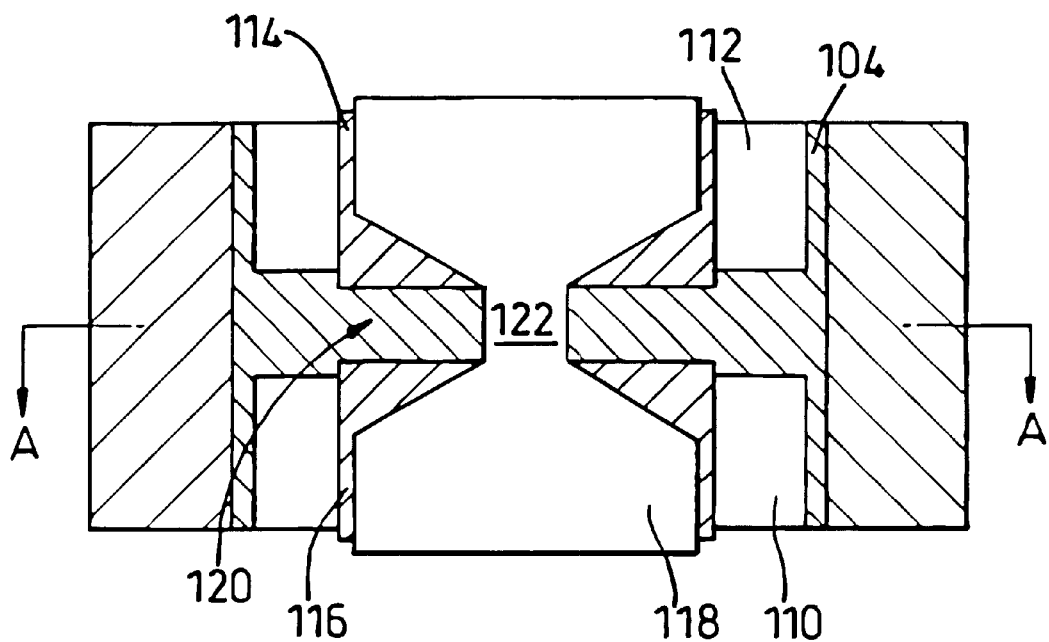
FIG. 6 shows a plan view of a transistor according to the present invention.
Figure 7:
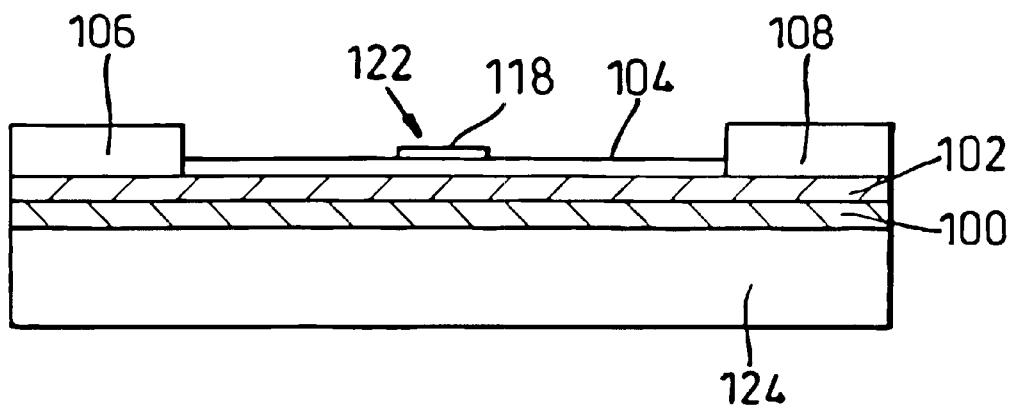
FIG. 7 shows an elevation along line AA in FIG. 6.

The device shown in FIG. 4 is of a simplified nature so that the principles of operation can be more easily explained. However, a more realistic device structure is shown in FIGS. 6 and 7.

A heterojunction is formed by a 20 nm thick layer of InAlSb (wide band gap second material) 100 provided in association with a 20 nm thick layer of InSb (narrow band gap first material) 102. The sheet of electrons are maintained by the heterojunction in a thin layer in the InSb layer near to the junction. This is to prevent tunnelling of electrons from the side and second gates into the InSb.

A source electrode 106 and a drain electrode 108 are provided at each end of the heterojunction on top of the InSb 102 layer. Between the source 106 and the drain 108 there is provided a layer of insulation 104, in this case $SiO_2$, on top of the InSb 102 layer.

At each side of the device, on top of the InSb 102 layer, there is provided a side gate electrode 110, 112 fabricated from a third material. The layer of $SiO_2$ insulates the side gate electrodes 110, 112 from the InSb layer 102. On top of each of the side gate electrodes there is provided a fillet of $SiO_2$ insulation 114, 116 which insulate a second gate electrode 118, in the shape of a bow tie, from the side gate electrodes 110, 112.

In the preferred embodiment the electrodes are fabricated from gold on top of a layer of chromium. The chromium ensures the gold adheres to the transistor. However, the choice of materials for the electrodes is not critical.

The two side gates 110, 112 are rectangular in plan and occupy a region at each side of the transistor. The two rectangular areas do not meet in the central region 120 of the transistor and thus the central region 120 is not covered by the side gates 110, 112. The middle portion (primary portion of the second gate electrode) 122 of the bow tie shaped second gate electrode 118 is arranged to be over the central region 120 of the transistor. This central region of the gate transmits a much larger voltage to the InSb than elsewhere since it is not screened by the $SiO_2$ fillet. This can be most clearly seen in FIG. 7.

At an underneath of the transistor, as viewed in FIG. 7, there is provided a first gate electrode 124. As with the device of FIG. 4 applying bias voltages between the first and second gate electrodes 124, 118 allows electrons to tunnel into the quantum central confined region, when an energy level in either the valence or conduction band (depending on whether p-type or n-type) equals the Fermi energy. As with a conventional transistor applying a voltage between the drain and the source electrodes causes a current to flow when conditions in the central region near the heterojunction are such that electrons can tunnel across.

The side gate electrodes 110, 112 allow the potential at the edge potions of the heterojunction to be held sufficiently high (at regions 150, 152 in FIG. 5) so as to ensure that electrons cannot be transmitted through this portion, but not too high, otherwise electrons could Zener tunnel from the central region, out of the gulley toward electrodes 150, 152. The potential applied to the side gate electrodes 110, 112 will be optimised to ensure that electrons are held within the gulley 35; a compromise value ensuring electrons can not bypass the potential maxima 37, nor tunnel out of the gulley 35 towards regions 150, 152.

Figure 10A:
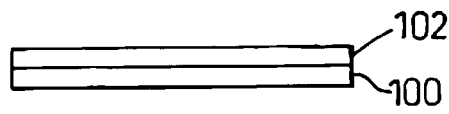
FIG. 10a shows a schematic representation of a heterojunction formed from a layer of a first material (narrow band gap semi-conductor) and a layer of a second material (wide band gap semi-conductor)
Figure 10B:
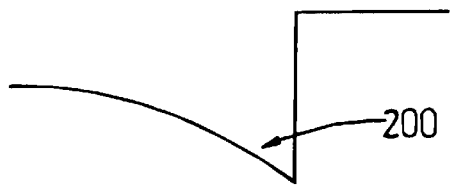

The skilled person will appreciate that the heterojunction can be formed by a variety of different methods, which are represented in FIGS. 10 and 11. In the previous figures the structure of FIG. 10a has been described with a layer of InSb (narrow band gap semi-conductor) 102, adjacent a layer of InAlSb (wide band gap semi-conductor) 100. This structure provides the potential profile shown in FIG. 10b. Electrons are held at the minimum of potential (shown at 200). However, should the potential profile be too shallow the confinement of the electrons within the thin sheet of charge near the heterojunction will not be strong and electrons can easily escape out of the plane of charge. FIG. 10a is a simplification of the earlier Figures and oxide layers and gates would be provided in addition to the layers 100, 102.

Figure 11A:
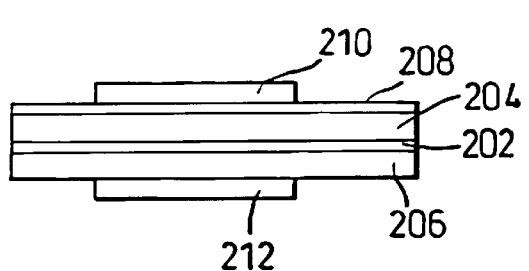
FIG. 11a shows a schematic representation of a heterojunction formed from a layer of a first material (narrow band gap semi-conductor) between two layers of a second material (wide band gap semi-conductor)

FIG. 11a shows an alternative structure for the heterojunction wherein a layer 202 of InSb (narrow band gap semi-conductor) has been provided between two layers of InAlSb (wide band gap semiconductor) 204, 206. The layer of InSb 202 is narrower than the layers of InAlSb 204, 206 to achieve the necessary potential conditions throughout the InSb to maintain electrons and also to achieve lattice mismatch as described hereinbefore thus imparting a permanent strain on the InSb layer. Clearly, should the layer 202 have significant thickness then two heterojunctions would be provided in series. However, the thickness of the InSb layer 102 cannot be too small because it becomes hard to fabricate and also the charge capacity (i.e. the number of electrons that the layer 102 can physically hold) becomes too small. In this embodiment the preferred thickness is 20 nm.

FIG. 11a also shows an oxide layer 208 that has been grown on top of the InAlSb layer 204. This oxide layer 208 may be necessary to remove material mismatch problems between a top gate electrode 210 and the InAlSb layer 204. A bottom gate electrode 212 is also shown.

Figure 11B:
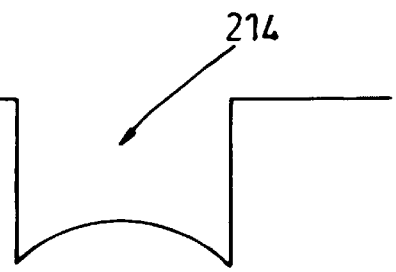

FIG. 11b shows the potential profile for the heterojunction formed by the structure of FIG. 11a. Rather than relying on the minimum of potential to hold electrons in the region 200 there is now a defined well 214 in which electrons are held. It does not matter whether or not the potential profile is too shallow; electrons will still be maintained within the thin sheet of charge in the vicinity of the heterojunction.

The structure of FIG. 11a is perhaps preferred over the structure of FIG. 10a in view of a cleaner junction interface at the top junction resulting in a higher carrier mobility.

A two dimensional electron sheet could also be provided by the use of modulation doping in a layer of wide band gap semi-conductor adjacent a layer of narrow band gap semi-conductor as will be appreciated by the skilled person.

The devices of FIGS. 4 and 6 rely on soft confinement (the provision of electric fields) to maintain electrons within the electron sheet provided by the heterojunction in a narrow strip or quantum wire. As the skilled person will appreciate hard confinement wherein the electrons are controlled by physical barriers to form a quantum wire is also possible. Such structures are shown in FIGS. 12 to 16.

Figure 12:
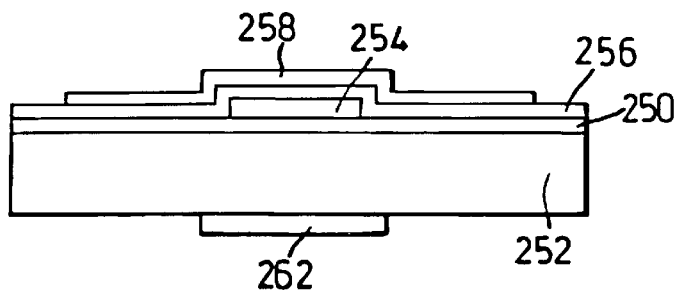
FIG. 12 shows a cross section through an alternative structure for fabricating the transistor.

FIG. 12 shows a first possibility wherein a layer of second material, or wide band gap semi-conductor 250 is provided on top of a substrate 252 which would generally be an $n^+$ material. A narrow strip of narrow band gap semi-conductor 254, or first material is provided on top of the wide band gap material. Generally this would be provided by depositing a layer of narrow band gap material onto the wide band gap material and then etching the narrow band gap material to the desired width.

Figure 14:
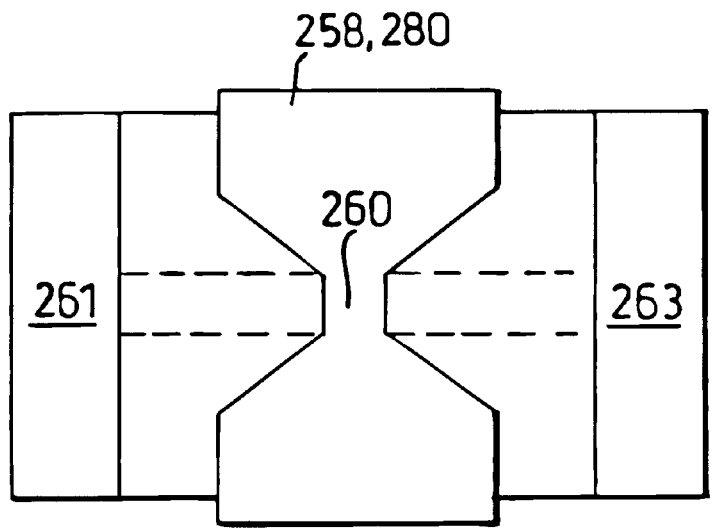
FIG. 14 shows a plan view of the structures of FIGS. 12 and 13.

Both the narrow band gap strip 254 and the wide band gap layer 250 are covered in a layer of insulator 256, in this case silicon dioxide. A second gate electrode 258 is provided which as can be seen in FIG. 14 is a bow tie shape having a primary portion 260, approximately 50 nm in width, which extends over the strip of narrow band gap material 254 (shown in outline).

A first electrode 262 is provided on the underside of the substrate 252. Also seen in FIG. 14 are third and fourth gate electrodes 261, 263 which form drain and source electrodes.

The device of FIG. 12 would operate in the same manner as those of FIGS. 4 and 6 except that are no side gates to which a potential must be applied. The electrons/holes are maintained in a strip due to the structure of the device. The quantum dot is provided within the strip of charge carriers by a potential applied between the first 262 and the second 254 gate electrodes.

Figure 13:
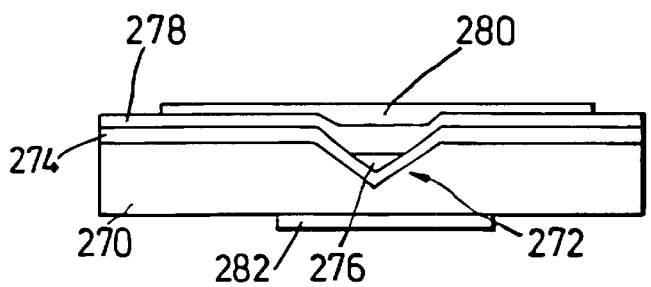
FIG. 13 shows a cross section through a further alternative of the structure of the transistor.

FIG. 13 shows a further structure for a transistor according to the invention which, as with the device of FIG. 12, relies on hard confinement to provide a quantum wire.

A substrate 270 is provided in which there is a V shaped groove 272. A layer of wide band gap semi-conductor 274 or second material is provided on top of the substrate which covers the surface of the groove 272. As the skilled person will appreciate the V of the groove in the substrate 270 will not be perfectly sharp but will be rounded. The layer of the wide band gap material 274 will also have a rounded V, as can be seen in FIG. 17.

Figure 17:
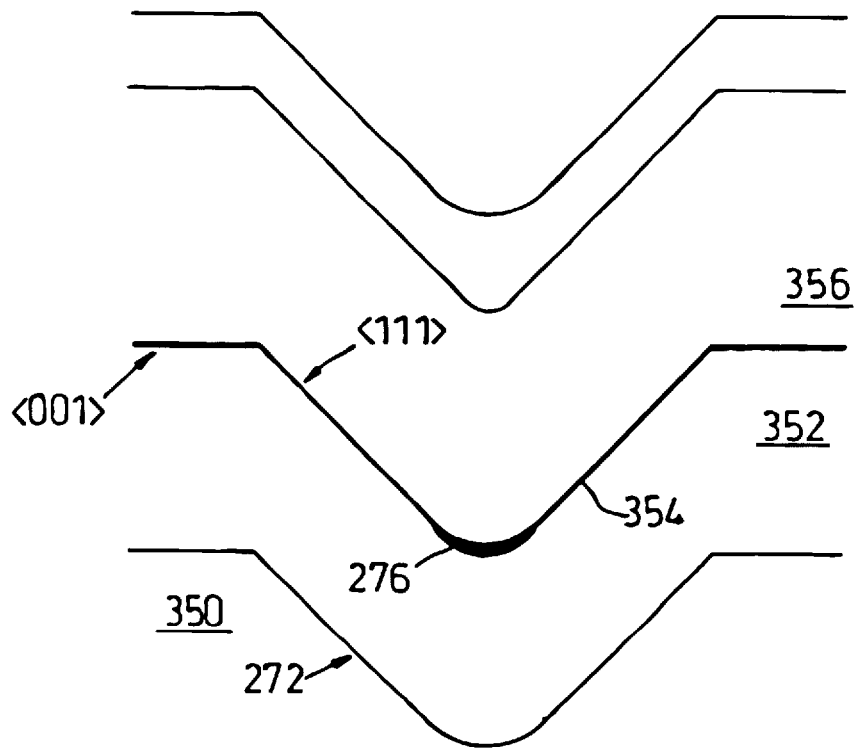
FIG. 17 shows further details of FIG. 3.

FIG. 17 shows an enlargement of the groove 272 of FIG. 13 where a substrate 350 is shown with the groove 272 fabricated therein. The groove has a rounded V portion. A layer 352 of second material has been deposited on the substrate 350. The lattice planes of second material at the edge portion of the V are <111> compared to <001> planes at surface regions outside the groove 272. The first material grows faster on the <001> planes during deposition and therefore a thin coating of first material 354 can be provided which is concentrated in the base of the groove 272. The groove is then filled with an insulator 356. The process can be repeated so a number of wires are provided vertically above one another.

A region of narrow band gap semi-conductor 276, or first material, is deposited on top of the layer of wide band gap semi-conductor 274. Due to the alignment of the lattice planes in the wide band gap semi-conductor the narrow band gap semi conductor is preferentially deposited in the V of the groove forming the region 276. It will be appreciated that a thin layer of the narrow band gap semi conductor will be present on the sides of the groove, but the material will be concentrated in the V of the groove.

A layer of insulation 278 is provided which fills the groove and covers the layer of wide band gap material. As will be appreciated although the narrow bad gap semi conductor is preferentially deposited in the V of the groove, a thin layer of narrow band gap semi conductor is likely to be present on the sides of the groove and will thus be sandwiched between the wide band gap semi conductor 352 and the insulator 278. On top of the layer of insulation there is provided a second gate electrode 280. As the previous embodiments a first gate electrode 282 is provided underneath the substrate 270.

The structure of FIG. 13 is also shown in plan in FIG. 14, wherein the second electrode 280 can be seen to have the bow tie structure with a primary portion 260 overlying the groove (shown in outline) and consequently the region of first material.

The device of FIG. 13 will operate in the same manner as the device of FIG. 12.

Figure 15:
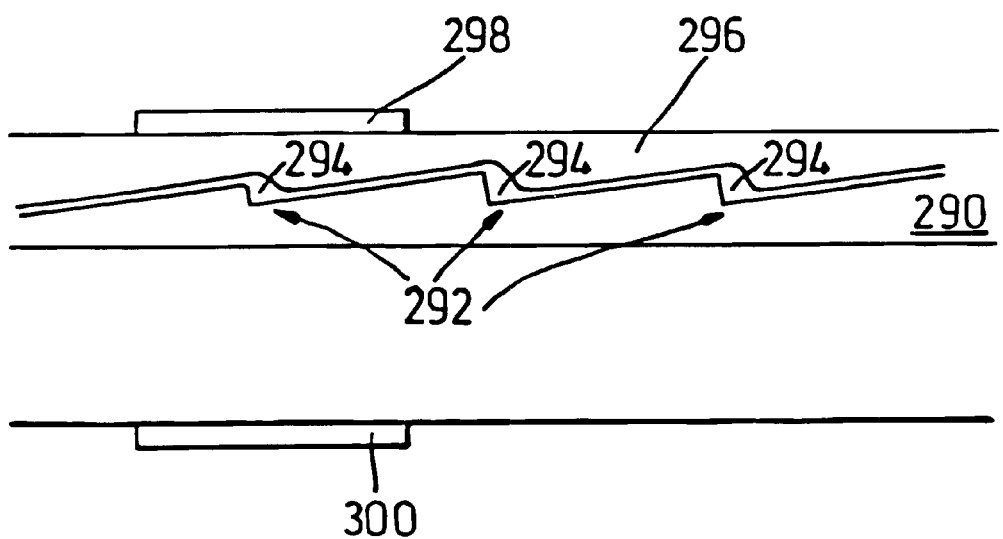
FIG. 15 shows a further view of a different possible structure for fabricating the transistor.

Yet a further alternative structure for providing a transistor according to the invention is shown in FIG. 15. In this structure a wafer of intrinsic wide band gap semi conductor 290 is provided. This wafer has been cut at an angle (possibly at up to substantially 60) to a plane wherein the atoms in the lattice are aligned. This provides a stepped surface as can be seen in the Figure.

A layer of narrow band semi conductor, or first material, is deposited on to the wide band gap material 290. Due to the stepped structure in the wide band gap material 290 the narrow band gap material is preferentially deposited in base regions of the steps 292 and thus regions of the narrow band gap semi-conductor 294 are provided. It will be appreciated that the narrow band gap semi-conductor will cover the wide band gap semi conductor but the regions 294 are of much greater thickness due to the preferential deposition.

A layer of insulator 296 is provided which covers the narrow band gap semi-conductor and a second electrode 298 is provided on top of the insulator. Again a first electrode 300 is provided underneath the structure.

The device of FIG. 15 functions in a similar manner to the device described in relation to FIGS. 12 and 13.

Figure 16:
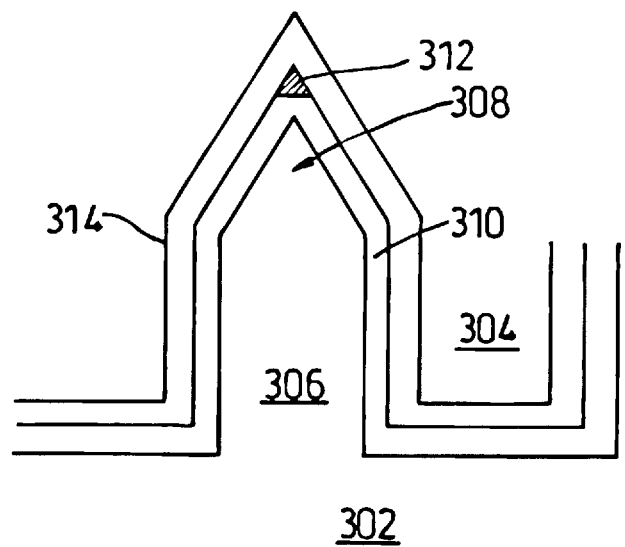
FIG. 16 shows still a further structure for fabricating the transistor.

FIG. 16 shows a further alternative structure for fabricating the transistor relying on hard confinement of electrons. A substrate 302 is etched with reverse mesa stripes 304 providing a plurality of ridges 306. The etching is such that sharp regions 308 are provided at end portions of the ridges 306.

The lattice structure is such that when further layers are deposited onto the ridges the deposition process is much more rapid on the side walls than at the sharp region 308. A wide band gap material is deposited on to the ridge 306 forming a layer 310. A layer of narrow band gap material 312 is deposited on to the wide band gap material 310. When the narrow band gap material is deposited the differential deposition rates are exploited so that primarily only a region of narrow band gap material exists at the top most region of the ridge 306. The structure is subsequently covered in an insulating layer 314. The insulation may completely fill the reverse mesa.

Gate electrodes are provided in the same manner as in FIGS. 12, 13, 15 and the device operates in a similar manner.

What is claimed is:

1. A field effect single electron transistor comprising:
   a first layer of semiconductor material having a band-gap less than substantially 0.5 eV and a layer of second material, said first layer of semiconductor material and said layer of second material forming a heterojunction,
   a first gate electrode being provided on a first side of said heterojunction and a second gate electrode being provided on a second side of said heterojunction which is on the opposite side of the heterojunction from the first side,
   a source electrode and a drain electrode provided at a first end and a second end, respectively, of said heterojunction along a plane running parallel to said first layer of semiconductor material,
   wherein the valence band and conduction band of said first layer of semiconductor material have sufficiently similar energy levels such that the top region of the valence band at one point within said first layer of semiconductor material can be forced to be higher than the bottom region of the conduction band at another point within said first layer of semiconductor material by application of a voltage between said first gate electrode and said second gate electrode.

2. A transistor according to claim 1, further including an additional layer of second material, said first layer of semiconductor material located between said layer of second material and said additional layer of second material.

3. A transistor according to claim 1 wherein the first material is one of the following materials: Insb, $Cd_xHg_{1-x}Te$.

4. A transistor according to claim 1 in which the second material is one of the following materials: InAlSb, $Cd_xHg_{1-x}Te$.

5. A transistor according to claim 1 wherein the second gate electrode is insulated from the materials forming the heterojunction by at least a single layer of insulation.

6. A transistor according to claim 1 wherein one or more side gates are provided.

7. A transistor according to claim 6 wherein the or each side gate comprises an elongate area along one side of the first or second material above the heterojunction.

8. A transistor according to claim 1 wherein two side gates are provided.

9. A transistor according to claim 8 wherein the two side gates are in the same plane and there exists a gap within that plane between the two areas of side gates.

10. A transistor according to claim 6 wherein the second gate electrode is provided above and insulated from the or each side gate.

11. A transistor according to claim 9 wherein the second gate electrode comprises a central portion which extends over the gap between the side gates.

12. A transistor according to claim 1 wherein the heterojunction is provided between a strip of the first material and a layer of the second material.

13. A transistor according to claim 12 wherein a gate electrode is provided overlying the strip of first material.

14. A transistor according to claim 1 wherein the transistor contains a V shaped notch or groove within a substrate.

15. A transistor according to claim 14 wherein a layer of the second material is provided lining the groove.

16. A transistor according to claim 15 wherein a region of the first material is provided in the V of the notch of the lined groove.

17. A transistor according to claim 1 wherein the transistor has a layer of second material having a non planar surface upon which a quantum wire has been fabricated.

18. A transistor according to claim 17 wherein the substrate has a surface which is stepped due to being cut off axis to a planar plane of the crystal lattice.

19. A transistor according to claim 1 wherein the transistor comprises at least one ridge grown quantum wire.

20. A transistor according to claim 1 which provides a controllable single potential barrier or well along a quantum wire in the potential field within a sheet of charge near the heterojunction.

21. A transistor according to claim 20 wherein the potential barrier or well is caused by applying a potential to the first and second gates.

22. A transistor according to claim 1 wherein energy states are utilised within the valence band.

23. A transistor according to claim 22 wherein the energy states are occupied by charge, carriers tunnelling into the valence band.

24. A transistor according to claim 23 wherein the tunnelling is Zener tunnelling.

25. A method of detection comprising using a charge detector wherein the first gate electrode and the second gate electrode of a field effect transistor according to claim 1 are connected to a potential source which is representative of the quantity being detected such that variations in the quantity causes variations in the potential applied to the first and second gate electrodes which, in turn, causes a change in current flowing through the transistor.

* * * * *